(12) United States Patent
Zheleva et al.

(10) Patent No.: US 6,265,289 B1
(45) Date of Patent: Jul. 24, 2001

(54) METHODS OF FABRICATING GALLIUM NITRIDE SEMICONDUCTOR LAYERS BY LATERAL GROWTH FROM SIDEWALLS INTO TRENCHES, AND GALLIUM NITRIDE SEMICONDUCTOR STRUCTURES FABRICATED THEREBY

(75) Inventors: Tsvetanka Zheleva, Chapel Hill; Darren B. Thomson, Cary, both of NC (US); Scott A. Smith, Centerville, OH (US); Kevin J. Linthicum, Angier, NC (US); Thomas Gehrke, Carrboro, NC (US); Robert F. Davis, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 0 days.

(21) Appl. No.: 09/327,136

(22) Filed: Jun. 7, 1999

Related U.S. Application Data

(60) Provisional application No. 60/088,761, filed on Jun. 10, 1998.

(51) Int. Cl.$^7$ .................................................. H01L 21/36
(52) U.S. Cl. .............................................................. 438/503
(58) Field of Search .................................. 438/478, 479, 438/492, 503, 938; 117/952

(56) References Cited

U.S. PATENT DOCUMENTS

| Re. 34,861 | 2/1995 | Davis et al. | 437/100 |
|---|---|---|---|
| 4,127,792 | 11/1978 | Nakata | 313/500 |
| 4,522,661 | 6/1985 | Morrison et al. | 148/33.2 |

(List continued on next page.)

FOREIGN PATENT DOCUMENTS

| 2258080 | 10/1998 | (CA) . |
|---|---|---|
| 0 551 721 A2 | 7/1993 | (EP) . |
| 0 852 416 A1 | 7/1998 | (EP) . |

(List continued on next page.)

OTHER PUBLICATIONS

International Search Report, PCT/US99/04346, Jun. 9, 1999.

(List continued on next page.)

*Primary Examiner*—Keith Christianson
(74) *Attorney, Agent, or Firm*—Myers Bigel Sibley & Sajovec

(57) ABSTRACT

A sidewall of an underlying gallium nitride layer is laterally grown into a trench in the underlying gallium nitride layer, to thereby form a lateral gallium nitride semiconductor layer. Microelectronic devices may then be formed in the lateral gallium nitride layer. Dislocation defects do not significantly propagate laterally from the sidewall into the trench in the underlying gallium nitride layer, so that the lateral gallium nitride semiconductor layer is relatively defect free. Moreover, the sidewall growth may be accomplished without the need to mask portions of the underlying gallium nitride layer during growth of the lateral gallium nitride layer. The defect density of the lateral gallium nitride semiconductor layer may be further decreased by growing a second gallium nitride semiconductor layer from the lateral gallium nitride layer. In one embodiment, the lateral gallium nitride layer is masked with a mask that includes an array of openings therein. The lateral gallium nitride layer is then grown through the array of openings and onto the mask, to thereby form an overgrown gallium nitride semiconductor layer. In another embodiment, the lateral gallium nitride layer is grown vertically. A plurality of second sidewalls are formed in the vertically grown gallium nitride layer to define a plurality of second trenches. The plurality of second sidewalls of the vertically grown gallium nitride layer are then laterally grown into the plurality of second trenches, to thereby form a second lateral gallium nitride layer. Microelectronic devices are then formed in the gallium nitride semiconductor layer.

80 Claims, 8 Drawing Sheets

U.S. PATENT DOCUMENTS

| | | | |
|---|---|---|---|
| 4,651,407 | 3/1987 | Bencuya | 29/571 |
| 4,865,685 | 9/1989 | Palmour | 156/643 |
| 4,876,210 | 10/1989 | Barnett et al. | 437/5 |
| 4,912,064 | 3/1990 | Kong et al. | 437/100 |
| 4,946,547 | 8/1990 | Palmour et al. | 156/643 |
| 5,122,845 | 6/1992 | Manabe et al. | 359/17 |
| 5,156,995 | 10/1992 | Fitzgerald, Jr. et al. | 437/90 |
| 5,389,571 | 2/1995 | Takeuchi et al. | 437/133 |
| 5,397,736 | 3/1995 | Bauser et al. | 437/92 |
| 5,549,747 | 8/1996 | Bozler et al. | 117/43 |
| 5,710,057 | 1/1998 | Kenney | 437/62 |
| 5,760,426 | 6/1998 | Marx et al. | 257/190 |
| 5,786,606 | 7/1998 | Nishio et al. | 257/103 |
| 5,815,520 | 9/1998 | Furushima | 372/45 |
| 5,877,070 | 3/1999 | Goesele et al. | 438/458 |
| 5,880,485 | 3/1999 | Marx et al. | 257/94 |
| 5,912,477 | 6/1999 | Negley | 257/95 |
| 6,051,849 | 4/2000 | Davis et al. | 257/103 |
| 6,100,104 | 8/2000 | Haerle | 438/33 |
| 6,100,111 | 8/2000 | Konstantinov | 438/92 |
| 6,156,584 | 12/2000 | Itoh et al. | 438/33 |

FOREIGN PATENT DOCUMENTS

| | | |
|---|---|---|
| 0 942 459 A2 | 9/1999 | (EP) . |
| 0 951 055 A2 | 10/1999 | (EP) . |
| 8-064791 | 3/1996 | (JP) . |
| 9-93315 | 4/1997 | (JP) . |
| 9-174494 | 6/1997 | (JP) . |
| 9-181071 | 7/1997 | (JP) . |
| 9-201477 | 7/1997 | (JP) . |
| 9-277448 | 10/1997 | (JP) . |
| 9-290098 | 10/1997 | (JP) . |
| 9-324997 | 11/1997 | (JP) . |
| WO 97/11518 | 3/1997 | (WO) . |
| WO 98/47170 | 10/1998 | (WO) . |

OTHER PUBLICATIONS

U.S. application No. 09/031,843, Davis et al., filed Feb. 27, 1998.

U.S. application No. 09/198,784, Linthicum et al., filed Nov. 24, 1998.

Linthicum et al., Pendeoepitaxy of Gallium Nitride Thin Films, Applied Physics Letters, vol. 75, No. 2, Jul. 12, 1999, pp. 196–198.

Zheleva et al., Pendeo–Epitaxy: A New Approach for Lateral Growth of Gallium Nitride Films, Journal of Electronic Materials, vol. 28, No. 4, Feb. 1999, pp. L5–L8.

Marchand et al., Microstructure of GaN Laterally Overgrown by Metalorganic Chemical Vapor Deposition, Applied Physics Letters, vol. 73, No. 6, Aug. 10, 1998, pp. 747–749.

Sakai et al., Transmission Electron Microscopy of Defects in GaN Films Formed by Epitaxial Lateral Overgrowth, vol. 73, No. 4, Jul. 27, 1998, pp. 481–483.

Nam et al., Lateral Epitaxial Overgrowth of GaN Films on $SiO_2$ Areas Via Metalorganic Vapor Phase Epitaxy, Journal of Electronic Materials, vol. 27, No. 4, 1998, pp. 233–237.

Wu et al., Growth and Characterization of SiC Films on Large–Areas Si Wafers by APCVD–Temperature Dependence, Materials Science Forum, vols. 264–268, 1998, pp. 179–182.

Nam et al., Lateral Epitaxy of Low Defect Density GaN Layers Via Organometallic Vapor Phase Epitaxy, Appl. Phys. Lett., vol. 71, No. 18, Nov. 3, 1997, pp. 2638–2640.

Zheleva et al., Dislocation Density Reduction Via Lateral Epitaxy in Selectively Grown GaN Structures, Appl. Phys. Lett., vol. 71, No. 17, Oct. 17, 1997, pp. 2472–2474.

Doverspike et al., The Effect of GaN and AlN Buffer Layers on GaN Film Properties Grown on Both C–Plane and A–Plane Sapphire, Journal of Electronic Materials, vol. 24, No. 4, 1995, pp. 269–273.

Kuznia et al., Influence of Buffer Layers on the Deposition of High Quality Single Crystal GaN Over Sapphire Substrates, J. Appl. Phys., vol. 73, No. 9, May 1, 1993, pp. 4700–4702.

Watanabe et al., The Growth of Single Crystalline GaN on a Si Substrate Using AlN As An Intermediate Layer, Journal of Crystal Growth, vol. 128, 1993, pp. 391–396.

Nakamura, GaN Growth Using GaN Buffer Layer, Japanese Journal of Applied Physics, vol. 30, No. 10A, Oct. 1991, pp. L1705–L1707.

Chen et al., Silicon–on–Insulator: Why, How, and When, AIP Conference Proceedings, vol. 167, No. 1, Sep. 15, 1998, pp. 310–319.

Amano et al., Metalorganic Vapor Phase Epitaxial Growth of a High Quality GaN Film Using an AlN Buffer Layer, Applied Physics Letters, vol. 48, No. 5, Feb. 3, 1986, pp. 353–355.

Yoshida et al., Improvements on the Electrical and Luminescent Properties of Reactive Molecular Beam Epitaxially Grown GaN Films by Using AlN–Coated Sapphire Substrates, Applied Physics Letters, vol. 42, No. 5, Mar. 1, 1983, pp. 427–429.

Zheleva et al., Pendeo–Epitaxy—A New Approach for Lateral Growth of GaN Structures, MRS Internet Journal of Nitride Semiconductor Research, 1999, Online!, vol. 4S1, No. G3.38, Nov. 30, 1998–Dec. 4, 1998.

International Search Report, PCT/US99/12967, Oct. 18, 1999.

Nakamura et al., High–Power, Long–Lifetime InGaN/GaN/AlGaN–Based Laser Diodes Grown on Pure GaN Substrates, Jpn. J. Appl. Phys., vol. 37, Mar. 15, 1998, pp. L309–L312.

Nakamura et al., InGaN/GaN/AlGaN–Based Laser Diodes Grown on GaN Substrates With a Fundamental Transverse Mode, Jpn. J. Appl. Phys., vol. 37, Sep. 15, 1998, pp. L1020–L1022.

Nakamura et al., InGaN/GaN/AlGaN–Based Laser Diodes With Modulation–Doped Strained–Layer Superlattices, Jpn. J. Appl. Phys., vol. 36, Dec. 1, 1997, pp. L1568–L1571.

Kapolnek et al., "Anisotropic Epitaxial Lateral Growth in GaN Selective Area Epitaxy", Appl. Phys. Lett. 71 (9), Sep. 1, 1997, pp. 1204–1206.

Usui et al., "Thick GaN Epitaxial Growth With Low Dislocation Density by Hydride Vapor Phase Epitaxy", Jpn. J. Appl. Phys., vol. 36, Part 2, No. 7B, Jul. 15, 1997, pp. 899–902.

Nam, et al., "Growth of GaN and $Al_{0.2}Ga_{0.8}N$ on Patterned Substrates Via Organometallic Vapor Phase Epitaxy", Jpn. J. Appl. Phys., vol. 36, Part 2, No. 5A, May 1, 1997, pp. 532–535.

Nam et al., "Selective Growth of GaN and $Al_{0.2}Ga_{0.8}N$ on GaN/AlN/6H—SiC(0001) Multilayer Substrates Via Organometallic Vapor Phase Epitaxy", Proceedings MRS, Dec. 1996, 6 pp.

Kapolnek et al., "Selective Area Epitaxy of GaN for Electron Field Emmission Devices", Journal of Crystal Growth, 5451, 1996, pp. 1–4.

Weeks et al, "GaN Thin Films Deposited Via Organometallic Vapor Phase Epitaxy on α(6H)—SiC(0001) Using High–Temperature Monocrystalline AlN Buffer Layers", Appl. Phys. Lett. 67 (3), Jul. 17, 1995, pp. 401–403.

Kato et al., "Selective Growth of Wurtzite GaN and $Al_xGa_{1-x}N$ on GaN/Sapphire Substrates by Metalorganic Vapor Phase Epitaxy", Journal of Crystal Growth, 144, 1994, pp. 133–140.

Yamaguchi et al, "Lateral Supply Mechanisms in Selective Metalorganic Chemical Vapor Deposition", Jpn. Appl. Phys., vol. 32 (1993), pp. 1523–1527.

International Search Report, PCT/US99/27358, Apr. 28, 2000.

International Search Report, PCT/US99/28056, Apr. 26, 2000.

Nakamura, InGaN–Based Violet Laser Diodes, Semicond. Sci. Technol., 14, 1999, pp. R27–R40.

Nakamura et al., Violet InGaN/GaN/AlGaN–Based Laser Diodes Operable at 50° C With a Fundamental Transverse Mode, Jpn. J. Appl. Phys. vol. 38, Part 1, No. 3A, Mar. 1, 1999, pp. L226–L229.

Boo et al., Growth of Hexagonal GaN Thin Films on Si(111) with Cubic SiC Buffer Layers, Journal of Crystal Growth 189–190, 1998, pp. 183–188.

Linthicum et al., Process Routes for Low–Defect Density GaN on Various Substrates Employing Pendeo–Epitaxial Growth Techniques, MRS Internet Journal of Nitride Semiconductor Research, Fall Meeting of the Materials Research Society, vol. 4S1, No. G4.9, Nov. 30, 1998–Dec. 4, 1998.

Steckl et al., SiC Rapid Thermal Corbonization of the (111)Si Semiconductor–on–Insulator Structure and Subsequent Metalorganic Chemical Vapor Deposition, Appl. Phys. Let., 69(15), Oct. 7, 1996, pp. 2264–2266.

T. Zheleva et al., "Dislocation density reduction via lateral epitaxy in selectively grown GaN structures", Appl. Phys. Lett. 71 (17), pp. 2472–2474, Oct. 1, 1997.*

Honda et al. *Selective Area Growth of GaN Microstructures on Patterned (111) and (001) SI Substrates*, $4^{th}$ European Workshop on GaN, Notthingham, UK, Jul. 2–5, 2000.

Gehrke et al., *Pendeo–Epitaxial Growth of Gallium Nitrade on Silicon Substrates*, Journal of Electronic Materials, vol. 29, No. 3, Mar. 2000, pp. 306–310.

Gehrke et al., *Pendeo–Epitaxy of Gallium Nitrade and Aluminum Nitrade Films and Heterostructures on Silicon Carbide Substrate*, MRS Internet J. Semicond. Res. 4S1, G3,2, 1999, 6 pp.

Thomson et al., *Ranges of Deposition Temperatures Applicable for Metalorganic Vapor Phase Epitaxy of GaN Films Via the Technique of Pendeo–Epitaxy*, MRS Internet J. Semicond. Res. 4SI, G3,37, 1999, 6 pp.

* cited by examiner

US 6,265,289 B1

METHODS OF FABRICATING GALLIUM NITRIDE SEMICONDUCTOR LAYERS BY LATERAL GROWTH FROM SIDEWALLS INTO TRENCHES, AND GALLIUM NITRIDE SEMICONDUCTOR STRUCTURES FABRICATED THEREBY

CROSS-REFERENCE TO PROVISIONAL APPLICATION

This application claims the benefit of Provisional Application Serial No. 60/088,761, filed Jun. 10, 1998, entitled "*Methods of Fabricating Gallium Nitride Semiconductor Layers by Lateral Growth From Sidewalls Into Trenches, and Gallium Nitride Semiconductor Structures Fabricated Thereby*".

FEDERALLY SPONSORED RESEARCH

This invention was made with Government support under Office of Naval Research Contract No. N00014-96-1-0765. The Government may have certain rights to this invention.

FIELD OF THE INVENTION

This invention relates to microelectronic devices and fabrication methods, and more particularly to gallium nitride semiconductor devices and fabrication methods therefor.

BACKGROUND OF THE INVENTION

Gallium nitride is being widely investigated for microelectronic devices including but not limited to transistors, field emitters and optoelectronic devices. It will be understood that, as used herein, gallium nitride also includes alloys of gallium nitride such as aluminum gallium nitride, indium gallium nitride and aluminum indium gallium nitride.

A major problem in fabricating gallium nitride-based microelectronic devices is the fabrication of gallium nitride semiconductor layers having low defect densities. It is known that one contributor to defect density is the substrate on which the gallium nitride layer is grown. Accordingly, although gallium nitride layers have been grown on sapphire substrates, it is known to reduce defect density by growing gallium nitride layers on aluminum nitride buffer layers which are themselves formed on silicon carbide substrates. Notwithstanding these advances, continued reduction in defect density is desirable.

It is also known to fabricate gallium nitride structures through openings in a mask. For example, in fabricating field emitter arrays, it is known to selectively grow gallium nitride on stripe or circular patterned substrates. See, for example, the publications by Nam et al. entitled "*Selective Growth of GaN and $Al_{0.2}Ga_{0.8}N$ on GaN/AlN/6H—SiC (0001) Multilayer Substrates Via Organometallic Vapor Phase Epitaxy*", Proceedings of the Materials Research Society, December 1996, and "*Growth of GaN and $Al_{0.2}Ga_{0.8}N$ on Patterened Substrates via Organometallic Vapor Phase Epitaxy*", Japanese Journal of Applied Physics., Vol. 36, Part 2, No. 5A, May 1997, pp. L532–L535. As disclosed in these publications, undesired ridge growth or lateral overgrowth may occur under certain conditions.

SUMMARY OF THE INVENTION

It is therefore an object of the present invention to provide improved methods of fabricating gallium nitride semiconductor layers, and improved gallium nitride layers so fabricated.

It is another object of the invention to provide methods of fabricating gallium nitride semiconductor layers that can have low defect densities, and gallium nitride semiconductor layers so fabricated.

These and other objects are provided, according to the present invention by laterally growing a sidewall of an underlying gallium nitride layer into a trench in the underlying gallium nitride layer, to thereby form a lateral gallium nitride layer. Microelectronic devices may then be formed in the lateral gallium nitride layer.

It has been found, according to the present invention, that dislocation defects do not significantly propagate laterally from the sidewall into the trench in the underlying gallium nitride layer, so that the lateral gallium nitride semiconductor layer is relatively defect free. The sidewall growth may be accomplished without the need to mask portions of the underlying gallium nitride layer during growth of the lateral gallium nitride layer.

According to another aspect of the present invention, a pair of sidewalls of the underlying gallium nitride layer are laterally grown into a trench in the underlying gallium nitride layer between the pair of sidewalls until the grown sidewalls coalesce in the trench. The lateral gallium nitride semiconductor layer may be laterally grown using metalorganic vapor phase epitaxy (MOVPE). For example, the lateral gallium nitride layer may be laterally grown using triethylgallium (TEG) and ammonia ($NH_3$) precursors at 1000–1100° C. and 45 Torr. Preferably, TEG at 13–39 $\mu$mol/min and $NH_3$ at 1500 sccm are used in combination with 3000 sccm $H_2$ diluent. Most preferably, TEG at 26 $\mu$mol/min, $NH_3$ at 1500 sccm and $H_2$ at 3000 sccm at a temperature of 1100° C. and 45 Torr are used. The underlying gallium nitride layer preferably is formed on a substrate such as 6H—SiC(0001), which itself includes a buffer layer such as aluminum nitride thereon. Other substrates such as sapphire, and other buffer layers such as low temperature gallium nitride, may be used. Multiple substrate layers and buffer layers also may be used.

The underlying gallium nitride layer including the sidewall may be formed by forming the trench in the underlying gallium nitride layer, such that the trench includes the sidewall. Alternatively, the sidewall may be formed by forming a post on the underlying gallium nitride layer, the post including the sidewall and defining the trench. A series of alternating trenches and posts is preferably formed to form a plurality of sidewalls. Trenches and/or posts may be formed by selective etching, selective epitaxial growth, combinations of etching and growth, or other techniques. The trenches may extend into the buffer layer and into the substrate.

The sidewall of the underlying gallium nitride layer is laterally grown into the trench, to thereby form the lateral gallium nitride layer of lower defect density than the defect density of the underlying gallium nitride layer. Some vertical growth may also occur. The laterally grown gallium nitride layer is vertically grown while propagating the lower defect density. Vertical growth may also take place simultaneous with the lateral growth.

The defect density of the overgrown gallium nitride semiconductor layer may be further decreased by growing a second gallium nitride semiconductor layer from the lateral gallium nitride layer. In one embodiment, the lateral gallium nitride layer is masked with a mask that includes an array of openings therein. The lateral gallium nitride layer is grown through the array of openings and onto the mask, to thereby form an overgrown gallium nitride semiconductor layer. In another embodiment, the lateral gallium nitride layer is grown vertically. A plurality of second sidewalls are formed in the vertically grown lateral gallium nitride layer to define a plurality of second trenches. The plurality of second sidewalls of the vertically grown lateral gallium nitride layer are then laterally grown into the plurality of second trenches, to thereby form a second lateral gallium nitride layer. Microelectronic devices are then formed in the gallium nitride semiconductor layer. The plurality of sidewalls of the underlying gallium nitride layer may be grown using metalorganic vapor phase epitaxy as was described above. The second sidewalls may be grown by etching and/or selective epitaxial growth of trenches and/or posts, as was described above.

Gallium nitride semiconductor structures according to the invention comprise an underlying gallium nitride layer including a trench having a sidewall, and a lateral gallium nitride layer that extends from the sidewall of the underlying gallium nitride layer into the trench. A vertical gallium nitride layer extends from the lateral gallium nitride layer. A plurality of microelectronic devices are included in the vertical gallium nitride layer. A series of alternating trenches and posts may be provided to define a plurality of sidewalls. The underlying gallium nitride layer includes a predetermined defect density, and the lateral gallium nitride layer is of lower defect density than the predetermined defect density.

Other embodiments of gallium nitride semiconductor structures according to the invention comprise a mask including an array of openings therein on the lateral gallium nitride layer and a vertical gallium nitride layer that extends from the lateral gallium nitride layer through the openings and onto the mask. Alternatively, a vertical gallium nitride layer extends from the lateral gallium nitride layer and includes a plurality of second sidewalls therein. A second lateral gallium nitride layer extends from the plurality of second sidewalls. Microelectronic devices are included in the second lateral gallium nitride layer. Accordingly, low defect density gallium nitride semiconductor layers may be produced, to thereby allow the production of high performance microelectronic devices.

DETAILED DESCRIPTION OF PREFERRED EMBODIMENTS

Figure 1:
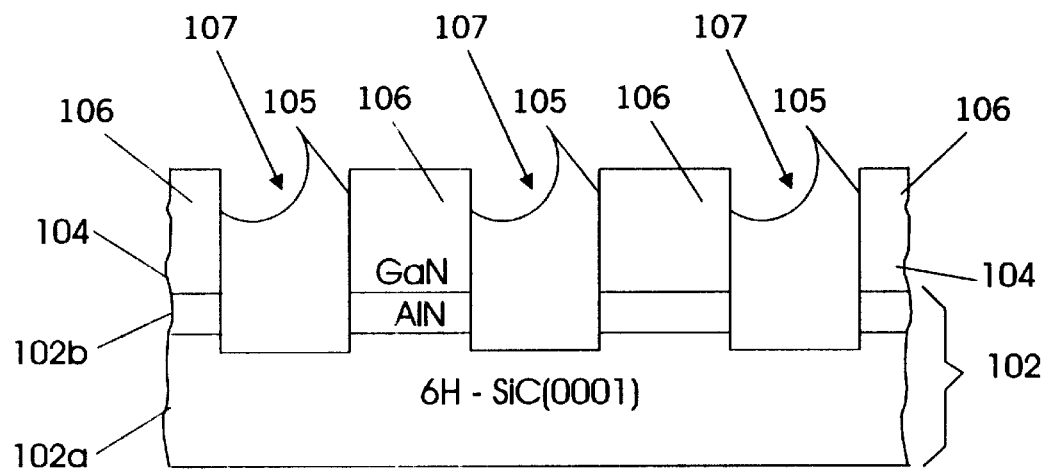
FIGS. 1–5 are across-sectional views of first embodiments of gallium nitride semiconductor structures during intermediate fabrication steps according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" or "onto" another element, it can be directly on the other element or intervening elements may also be present. Moreover, each embodiment described and illustrated herein includes its complementary conductivity type embodiment as well.

Referring now to FIGS. 1–5, methods of fabricating gallium nitride semiconductor structures according to a first embodiment of the present invention will now be described. As shown in FIG. 1, an underlying gallium nitride layer 104 is grown on a substrate 102. The substrate 102 may include a 6H—SiC(0001) substrate 102a and an aluminum nitride buffer layer 102b. The crystallographic designation conventions used herein are well known to those having skill in the art, and need not be described further. The gallium nitride layer 104 may be between 1.0 and 2.0 $\mu$m thick, and may be grown at 1000° C. on a high temperature (1100° C.) aluminum nitride buffer layer 102b that was deposited on the 6H—SiC substrate 102a in a cold wall vertical and inductively heated metalorganic vapor phase epitaxy system using triethylgallium at 26 $\mu$mol/min, ammonia at 1500 sccm and 3000 sccm hydrogen diluent. Additional details of this growth technique may be found in a publication by T. W. Weeks et al. entitled "*GaN Thin Films Deposited Via Organometallic Vapor Phase Epitaxy on $\alpha(6H)$—SiC(0001) Using High-Temperature Monocrystalline AlN Buffer Layers*", Applied Physics Letters, Vol. 67, No. 3, Jul. 17, 1995, pp. 401–403, the disclosure of which is hereby incorporated herein by reference. Other substrates, with or without buffer layers, may be used.

Still referring to FIG. 1, the underlying gallium nitride layer 104 includes a plurality of sidewalls 105 therein. It will be understood by those having skill in the art that the sidewalls 105 may be thought of as being defined by a plurality of spaced apart posts 106, that also may be referred to as "mesas", "pedestals" or "columns". The sidewalls 105 may also be thought of as being defined by a plurality of trenches 107, also referred to as "wells" in the underlying gallium nitride layer 104. The sidewalls 105 may also be thought of as being defined by a series of alternating trenches 107 and posts 106. It will be understood that the posts 106 and the trenches 107 that define the sidewalls 105 may be fabricated by selective etching and/or selective epitaxial growth and/or other conventional techniques. Moreover, it will also be understood that the sidewalls need not be orthogonal to the substrate 102, but rather may be oblique thereto. Finally, it will also be understood that although the sidewalls 105 are shown in cross-section in FIG. 1, the posts 106 and trenches 107 may define elongated regions that are straight, V-shaped or have other shapes. As shown in FIG. 1, the trenches 107 may extend into the buffer layer 102b and into the substrate 102a, so that subsequent gallium nitride growth occurs preferentially on the sidewalls 105 rather than on the trench floors. In other embodiments, the trenches may not extend into the substrate 102a, and also may not extend into buffer layer 102b, depending, for example, on the trench geometry and the lateral versus vertical growth rates of the gallium nitride.

Figure 2:
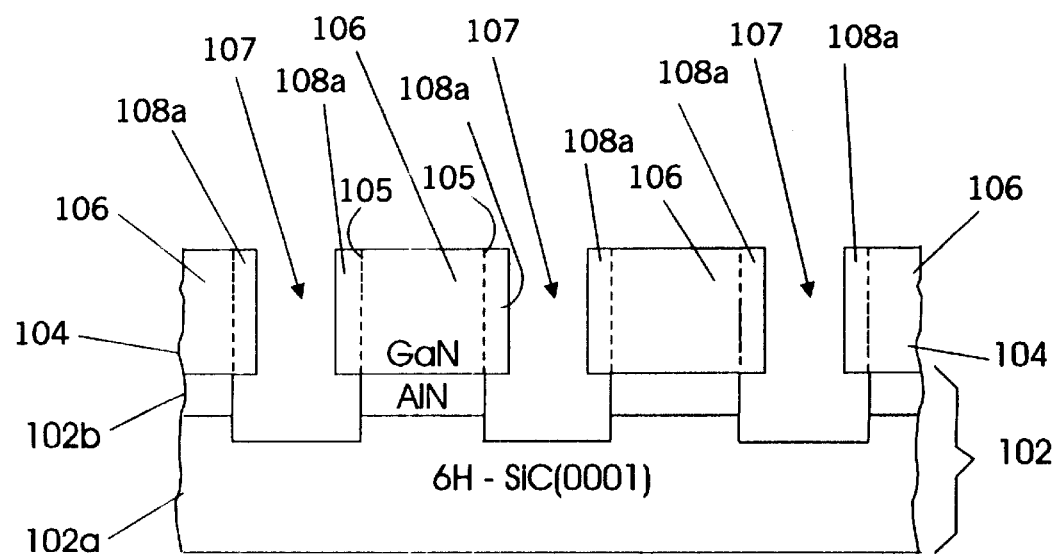

Referring now to FIG. 2, the sidewalls 105 of the underlying gallium nitride layer 104 are laterally grown to form a lateral gallium nitride layer 108a in the trenches 107. Lateral growth of gallium nitride may be obtained at 1000–1100° C. and 45 Torr. The precursors TEG at 13–39 $\mu$mol/min and NH$_3$ at 1500 sccm may be used in combination with a 3000 sccm H$_2$ diluent. If gallium nitride alloys are formed, additional conventional precursors of aluminum or indium, for example, may also be used. As used herein, the term "lateral" means a direction that is orthogonal to the sidewalls 105. It will also be understood that some vertical growth on the posts 106 may also take place during the lateral growth from sidewalls 105. As used herein, the term "vertical" denotes a directional parallel to the sidewalls 105.

Figure 3:
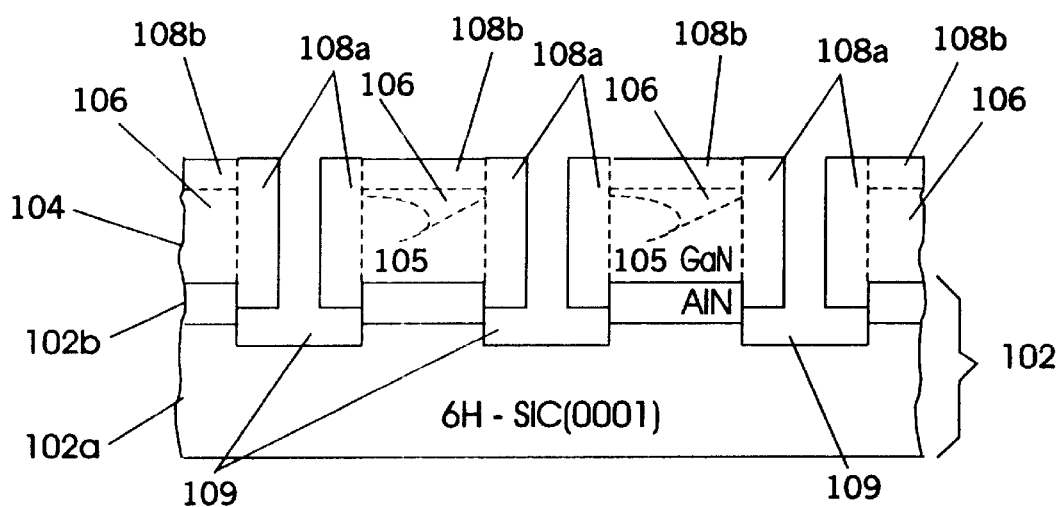

Referring now to FIG. 3, continued growth of the lateral gallium nitride layer 108a causes vertical growth onto the underlying gallium nitride layer 104, specifically onto the posts 106, to form a vertical gallium nitride layer 108b. Growth conditions for vertical growth may be maintained as was described in connection with FIG. 2. As also shown in FIG. 3, continued vertical growth into trenches 107 may take place at the bottom of the trenches.

Figure 4:
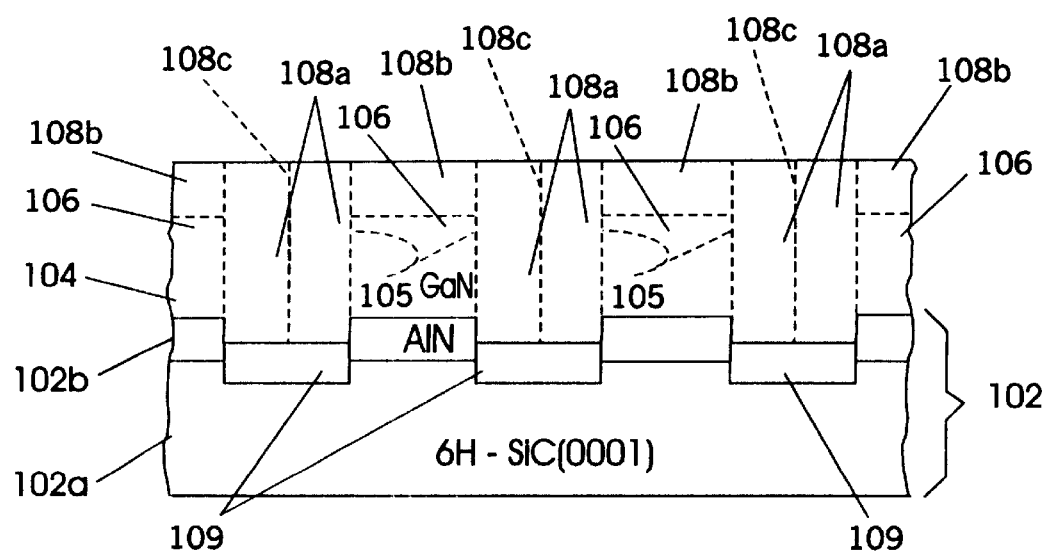
Figure 5:
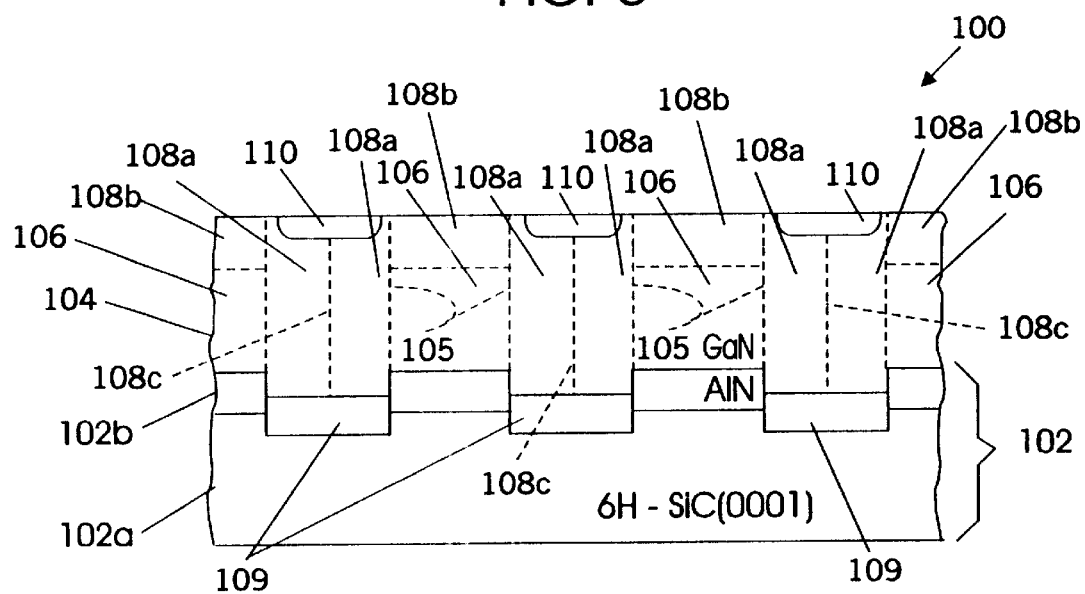
Figure 6:
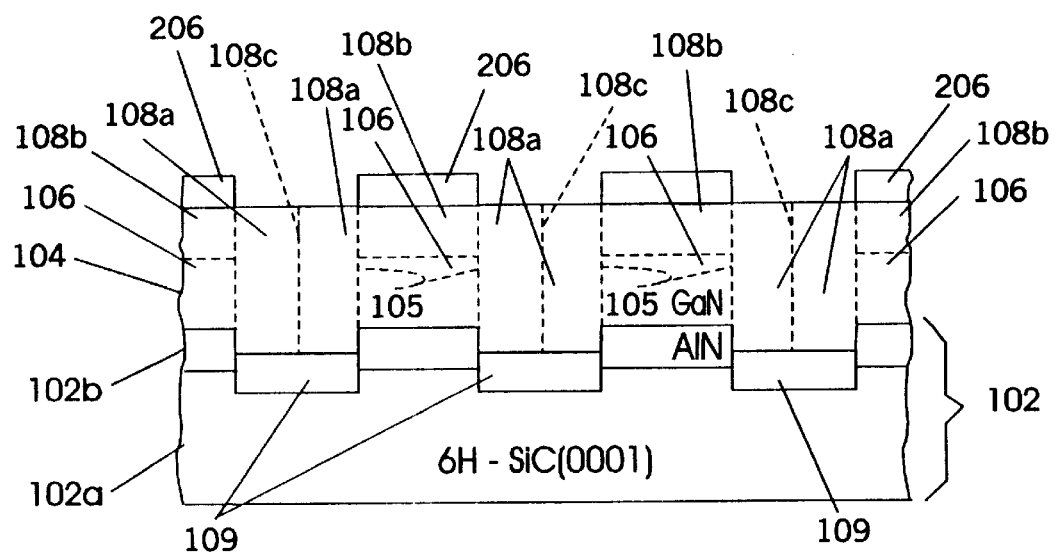
FIGS. 6–10 are cross-sectional views of second embodiments of gallium nitride semiconductor structures during intermediate fabrication steps according to the present invention.

Referring now to FIG. 4, growth is allowed to continue until the lateral growth fronts coalesce in the trenches 107 at the interfaces 108c, to form a continuous gallium nitride semiconductor layer in the trenches. The total growth time may be approximately 60 minutes. As shown in FIG. 5, microelectronic devices 110 may then be formed in the lateral gallium nitride semiconductor layer 108a. Devices may also be formed in vertical gallium nitride layer 108b.

Accordingly, in FIG. 5, gallium nitride semiconductor structures 100 according to a first embodiment of the present invention are illustrated. The gallium nitride structures 100 include the substrate 102. The substrate may be sapphire or gallium nitride or other conventional substrates. However, preferably, the substrate includes the 6H—SiC(0001) substrate 102a and the aluminum nitride buffer layer 102b on the silicon carbide substrate 102a. The aluminum nitride buffer layer 102b may be 0.1 μm thick.

The fabrication of the substrate 102 is well known to those having skill in the art and need not be described further. Fabrication of silicon carbide substrates are described, for example, in U.S. Pat. No. 4,865,685 to Palmour; Re 34,861 to Davis et al.; U.S. Pat. No. 4,912,064 to Kong et al. and U.S. Pat. No. 4,946,547 to Palmour et al., the disclosures of which are hereby incorporated herein by reference.

The underlying gallium nitride layer 104 is also included on the buffer layer 102b opposite the substrate 102a. The underlying gallium nitride layer 104 may be between about 1.0 and 2.0 μm thick, and may be formed using metalorganic vapor phase epitaxy (MOVPE). The underlying gallium nitride layer generally has an undesired relatively high defect density. For example, dislocation densities of between about $10^8$ and $10^{10}$ cm$^{-2}$ may be present in the underlying gallium nitride layer. These high defect densities may result from mismatches in lattice parameters between the buffer layer 102b and the underlying gallium nitride layer 104, and/or other causes. These high defect densities may impact the performance of microelectronic devices formed in the underlying gallium nitride layer 104.

Still continuing with the description of FIG. 5, the underlying gallium nitride layer 104 includes the plurality of sidewalls 105 that may be defined by the plurality of pedestals 106 and/or the plurality of trenches 107. As was described above, the sidewalls may be oblique and of various elongated shapes.

Continuing with the description of FIG. 5, the lateral gallium nitride layer 108a extends from the plurality of sidewalls 105 of the underlying gallium nitride layer 104. The lateral gallium nitride layer 108a may be formed using metalorganic vapor phase epitaxy at about 1000–1100° C. and 45 Torr. Precursors of triethygallium (TEG) at 13–391 μmol/min and ammonia (NH$_3$) at 1500 sccm may be used in combination with a 3000 sccm H$_2$ diluent, to form the lateral gallium nitride layer 108a.

Still continuing with the description of FIG. 5, the gallium nitride semiconductor structure 100 also includes the vertical gallium nitride layer 108b that extends vertically from the posts 106.

As shown in FIG. 5, the lateral gallium nitride layer 108a coalesces at the interfaces 108c to form a continuous lateral gallium nitride semiconductor layer 108a in the trenches. It has been found that the dislocation densities in the underlying gallium nitride layer 104 generally do not propagate laterally from the sidewalls 105 with the same density as vertically from the underlying gallium nitride layer 104. Thus, the lateral gallium nitride layer 108a can have a relatively low defect density, for example less that $10^4$ cm$^{-2}$. Accordingly, the lateral gallium nitride layer 108a may form device quality gallium nitride semiconductor material. Thus, as shown in FIG. 5, microelectronic devices 110 may be formed in the lateral gallium nitride semiconductor layer 108a. It will also be understood that a mask need not be used to fabricate the gallium nitride semiconductor structures 100 of FIG. 5, because lateral growth is directed from the sidewalls 105.

Referring now to FIGS. 6–10, second embodiments of gallium nitride semiconductor structures and fabrication methods according to the present invention will now be described. First, gallium nitride semiconductor structures of FIG. 4 are fabricated as was already described with regard to FIGS. 1–4. Then, referring to FIG. 6, the posts 106 are masked with a mask 206 that includes an array of openings therein. The mask may comprise silicon dioxide at thickness of 1000 Å and may be deposited using low pressure chemical vapor deposition at 410° C. Other masking materials may be used. The mask may be patterned using standard photolithography techniques and etched in a buffered HF solution. In one embodiment, the openings are 3 μm-wide openings that extend in parallel at distances of between 3 and 40 μm and that are oriented along the <1$\bar{1}$00> direction on the lateral gallium nitride layer 108a. Prior to further processing, the structure may be dipped in a 50% hydrochloric acid (HCl) solution to remove surface oxides. It will be understood that although the mask 206 is preferably located above the posts 106, it can also be offset therefrom.

Figure 7:
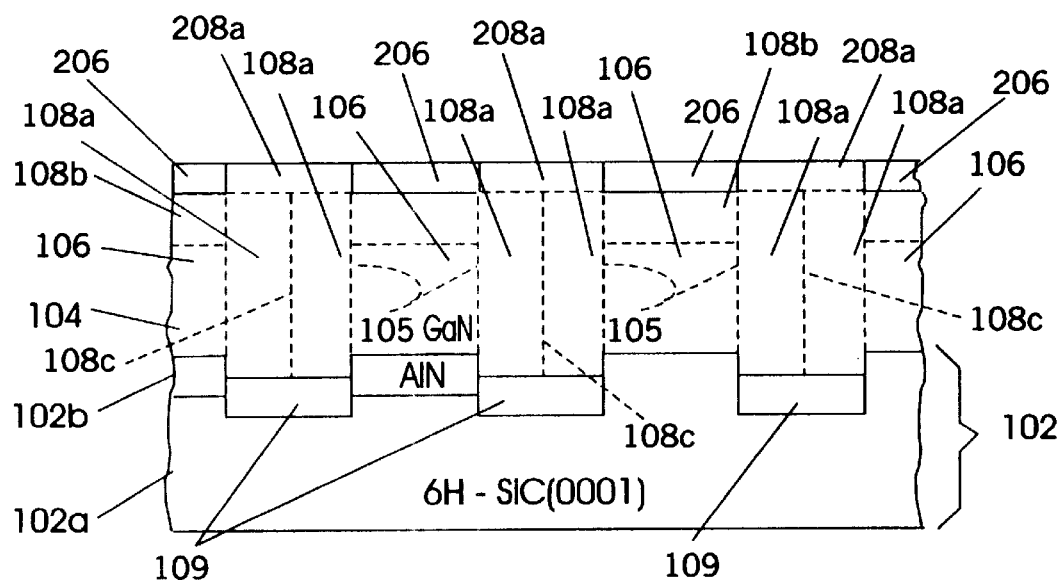

Referring now to FIG. 7, the lateral gallium nitride semiconductor layer 108a is grown through the array of openings to form a vertical gallium nitride layer 208a in the openings. Growth of gallium nitride may be obtained, as was described in connection with FIG. 2.

It will be understood that growth in two dimensions may be used to form an overgrown gallium nitride semiconductor layer. Specifically, the mask 206 may be patterned to include an array of openings that extend along two orthogonal directions such as <1$\bar{1}$00> and <11$\bar{2}$0>. Thus, the openings can form a rectangle of orthogonal striped patterns. In this case, the ratio of the edges of the rectangle is preferably proportional to the ratio of the growth rates of the {11$\bar{2}$0} and {1$\bar{1}$01} facets, for example, in a ratio of 1.4:1. The openings can be equitriangular with respect to directions such as <1$\bar{1}$00> and <11$\bar{2}$0>.

Figure 8:
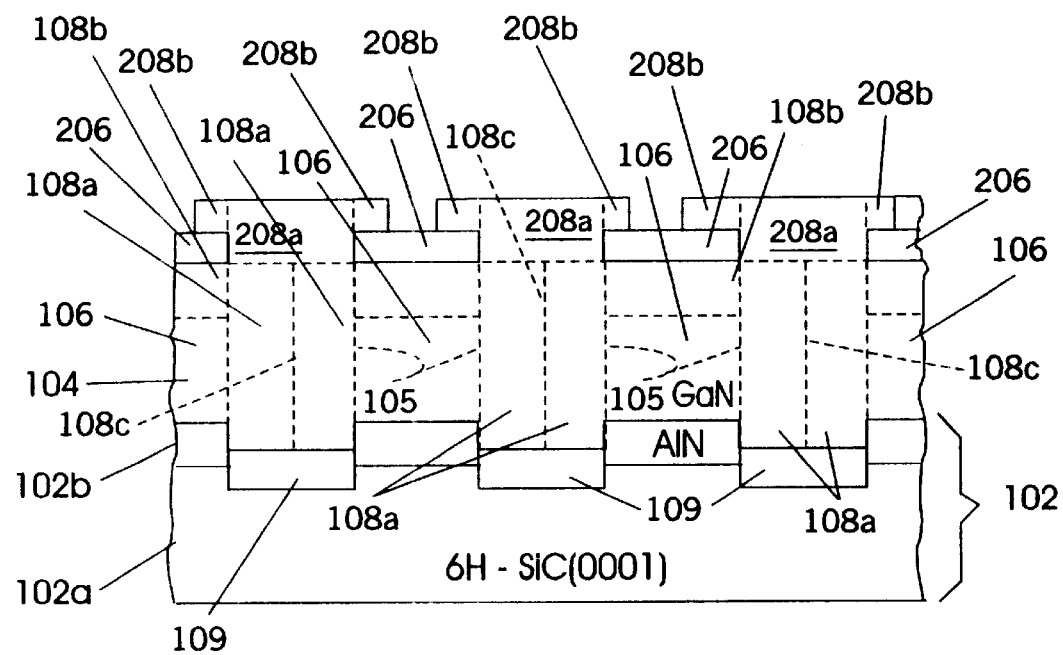

Referring now to FIG. 8, continued growth of the vertical gallium nitride layer 208a causes lateral growth onto the mask 206, to form a second lateral gallium nitride layer 208b. Conditions for overgrowth may be maintained as was described in connection with FIG. 7.

Figure 9:
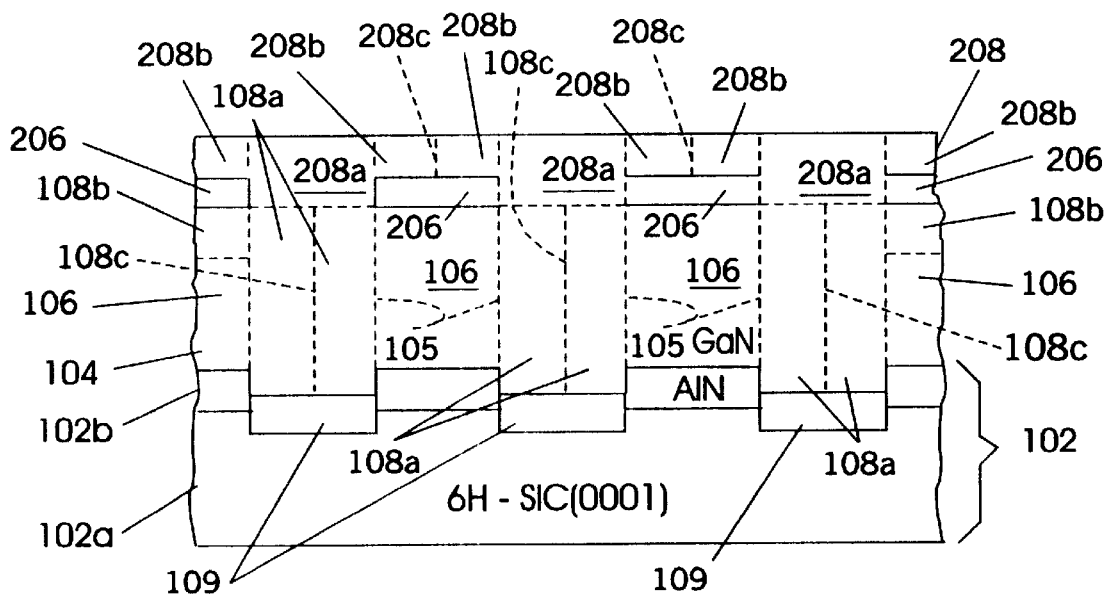
Figure 10:
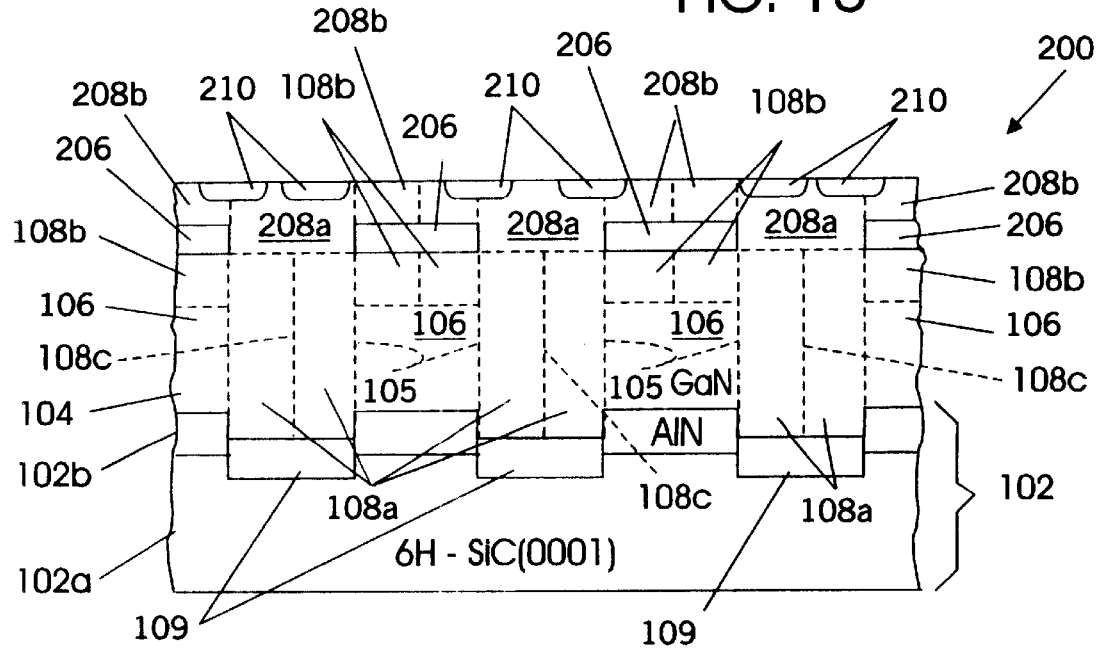
Figure 11:
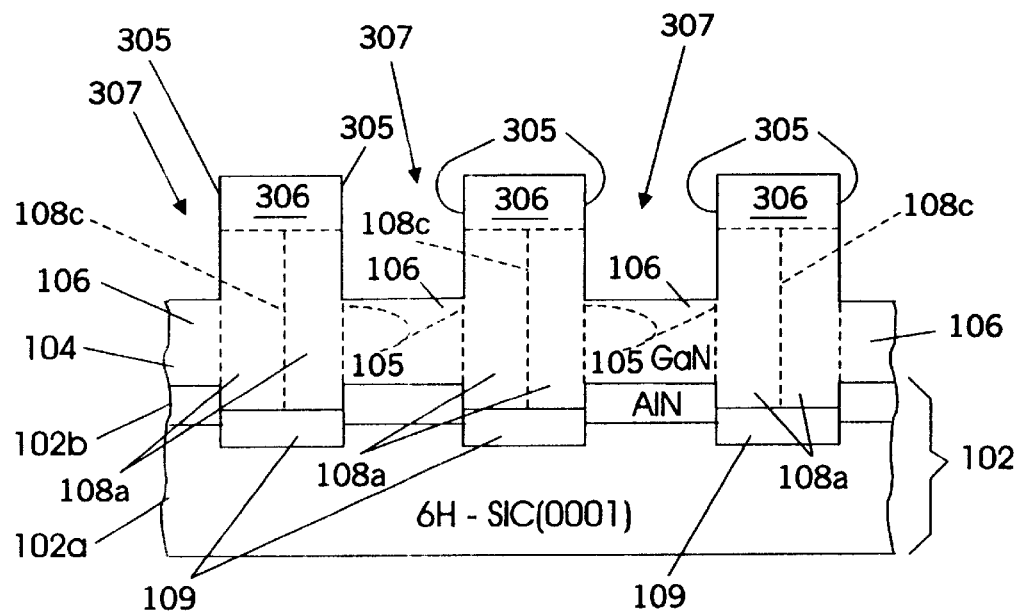
FIGS. 11–15 are cross-sectional views of third embodiments of gallium nitride semiconductor structures during intermediate fabrication steps according to the present invention.

Referring now to FIG. 9, lateral overgrowth is allowed to continue until the lateral growth fronts coalesce at the second interfaces 208c on the mask 206 to form a continuous overgrown gallium nitride semiconductor layer 208. The total growth time may be approximately sixty minutes. As shown in FIG. 10, microelectronic devices 210 may then be formed in the second lateral gallium nitride layer 208b. The microelectronic devices may also be formed in the vertical gallium nitride layer 208a.

Accordingly, by providing the second lateral growth layer 208b, defects that were present in continuous gallium nitride semiconductor layer 108 may be reduced even further, to obtain device quality gallium nitride in the gallium nitride semiconductor structure 200.

Referring now to FIGS. 11–15, third embodiments of gallium nitride semiconductor structures and fabrication methods according to the present invention will now be described. First, gallium nitride semiconductor structures of FIG. 4 are fabricated as was already described in connection with FIGS. 1–4. Then, a plurality of second sidewalls 305 are formed. The second sidewalls 305 may be formed by selective epitaxial growth of second posts 306 by etching second trenches 307 in the first posts 106 and/or combinations thereof. As was already described, the second sidewalls 305 need not be orthogonal to substrate 102, but rather may be oblique. The second trenches 307 need not be directly over the first posts 106, but may be laterally offset therefrom. The second trenches are preferably deep so that lateral growth preferentially occurs on the sidewalls 305 rather than on the bottom of second trenches 306.

Figure 12:
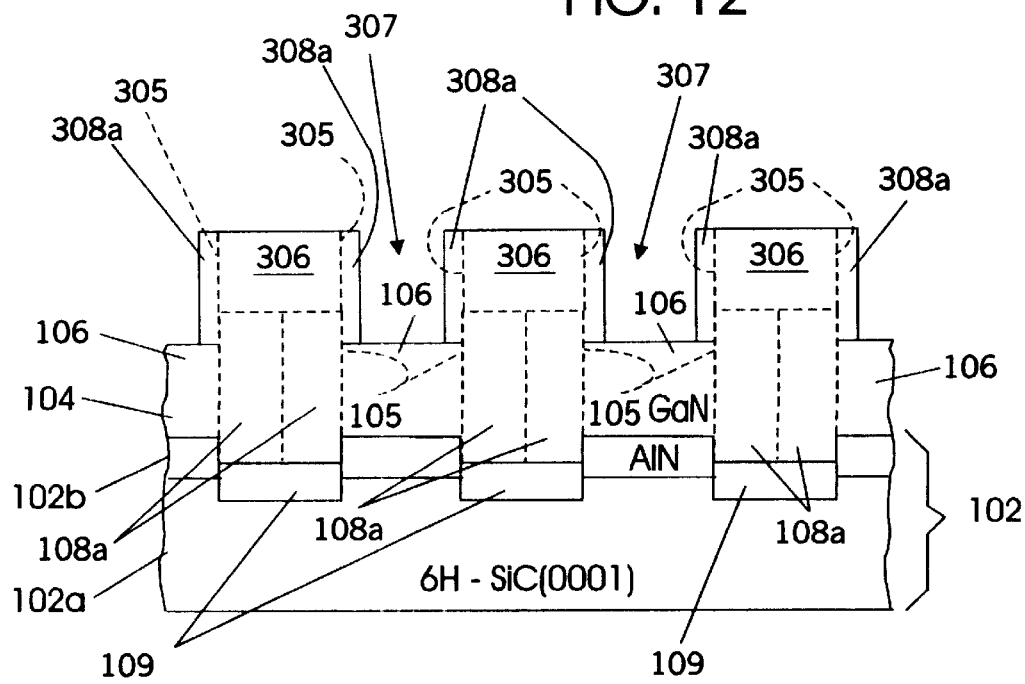

Referring now to FIG. 12, the second sidewalls 305 of the second posts 306 and/or the second trenches 307 are laterally grown to form a second lateral gallium nitride layer 308a in the second trenches 307. As was already described, lateral growth of gallium nitride may be obtained at 1000–1100° C. and 45 Torr. The precursors TEG at 13–39 μmol/min and NH$_3$ at 1500 sccm may be used in combination with a 3000 sccm H$_2$ diluent. If gallium nitride alloys are formed, additional conventional precursors of aluminum or indium, for example, may also be used. It will also be understood that some vertical growth may take place on the second posts 306 during the lateral growth from the second sidewalls 305.

Figure 13:
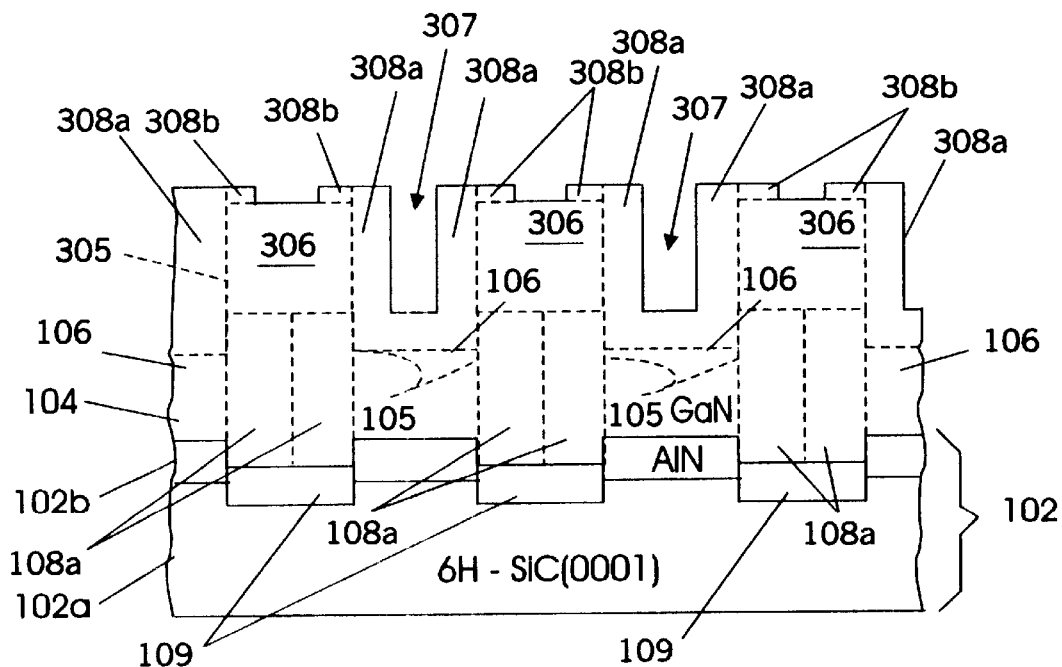

Referring now to FIG. 13, continued growth of the second lateral gallium nitride layer 308a causes vertical growth onto the second posts 306, to form a second vertical gallium nitride layer 308b. As also shown, vertical growth from the floors of the second trenches and from the tops of the second posts may also take place. Growth conditions for vertical growth may be maintained as was described in connection with FIG. 12.

Figure 14:
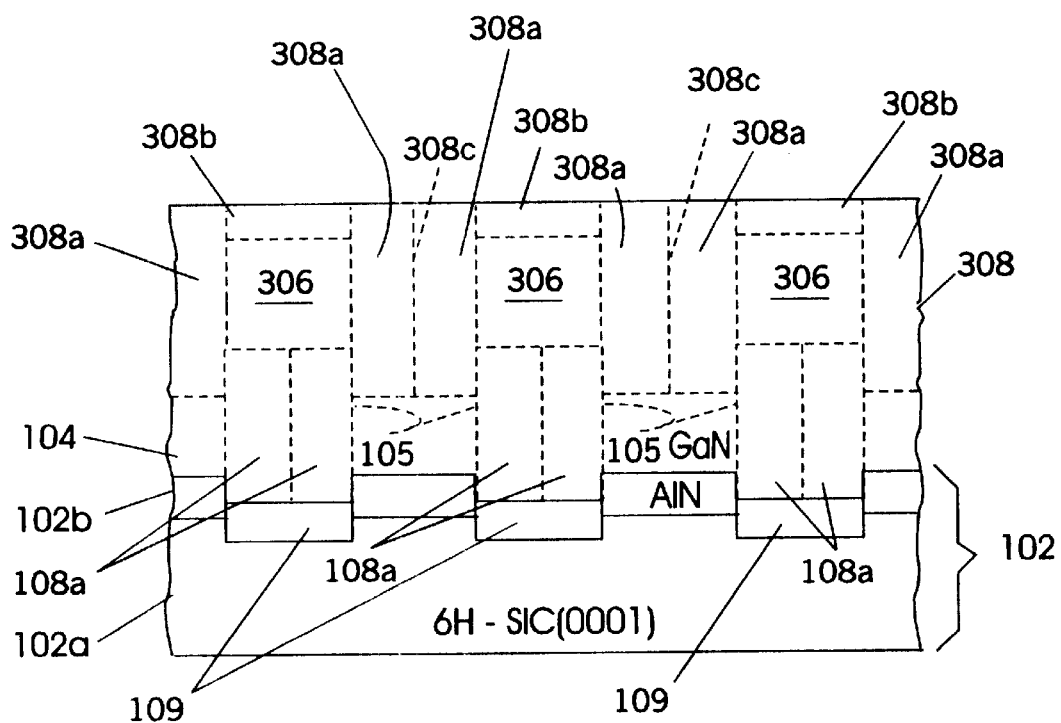
Figure 15:
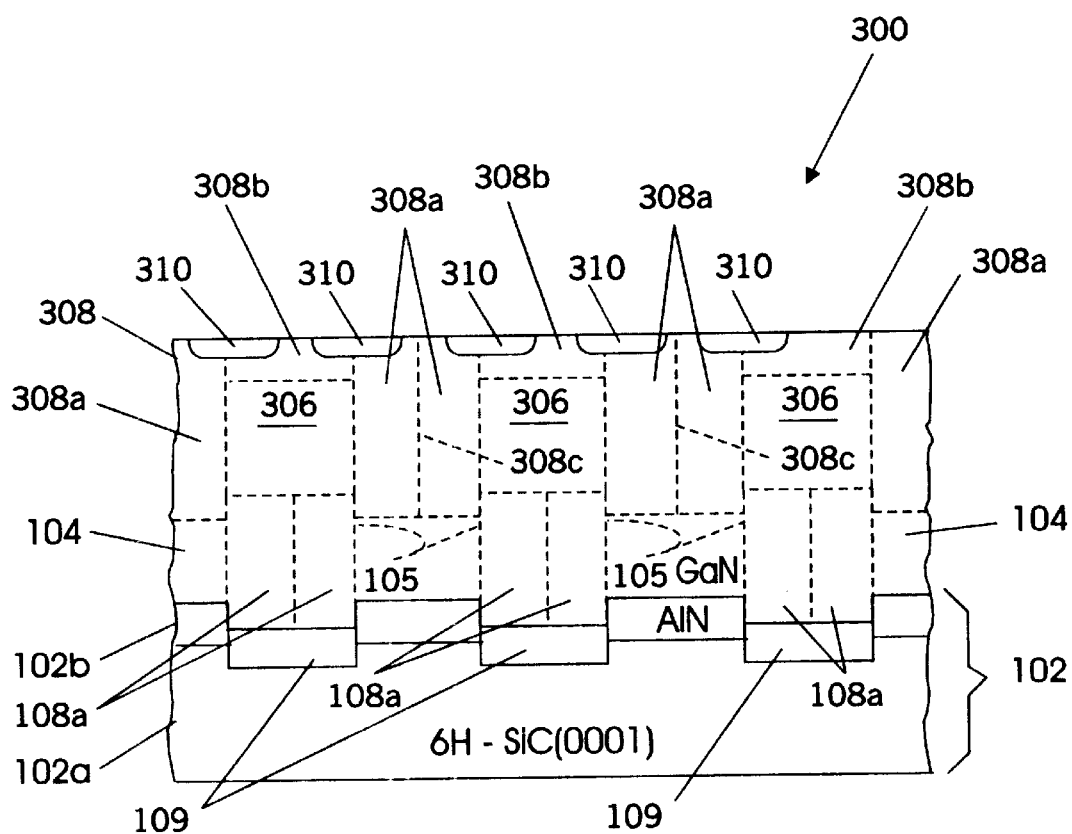

Referring now to FIG. 14, growth is allowed to continue until the lateral growth fronts coalesce in the second trenches 307 at the second interfaces 308c to form a second continuous gallium nitride semiconductor layer 308. The total growth time may be approximately sixty minutes. As shown in FIG. 15, microelectronic devices 310 may then be formed in the second continuous gallium nitride semiconductor layer 308.

Accordingly, third embodiments of gallium nitride semiconductor structures 300 according to the present invention may be formed without the need to mask gallium nitride for purposes of defining lateral growth. Rather, lateral growth from first and second sidewalls may be used. By performing two separate lateral growths, the defect density may be reduced considerably.

Additional discussion of methods and structures of the present invention will now be provided. The first and second trenches 107 and 307 and the openings in the mask 206 are preferably rectangular trenches and openings that preferably extend along the <11$\bar{2}$0> and/or <1$\bar{1}$00> directions on the underlying gallium nitride layer 104 or the first lateral gallium nitride layer 108a. Truncated triangular stripes having (1$\bar{1}$01) slant facets and a narrow (0001) top facet may be obtained for trenches and/or mask openings along the <11$\bar{2}$0> direction. Rectangular stripes having a (0001) top facet, (11$\bar{2}$0) vertical side faces and (1$\bar{1}$01) slant facets may be grown along the <1$\bar{1}$00> direction. For growth times up to 3 minutes, similar morphologies may be obtained regardless of orientation. The stripes develop into different shapes if the growth is continued.

The amount of lateral growth generally exhibits a strong dependence on trench and/or mask opening orientation. The lateral growth rate of the <1$\bar{1}$00> oriented trenches and/or mask openings is generally much faster than those along <11$\bar{2}$0>. Accordingly, it is most preferred to orient the trenches and/or mask openings, so that they extend along the <1$\bar{1}$00> direction of the underlying gallium nitride layer 104 or the first lateral gallium nitride layer 108a.

The different morphological development as a function of trench and/or mask opening orientation appears to be related to the stability of the crystallographic planes in the gallium nitride structure. Trenches and/or mask openings oriented along <11$\bar{2}$0> may have wide (1$\bar{1}$00) slant facets and either a very narrow or no (0001) top facet depending on the growth conditions. This may be because (1$\bar{1}$01) is the most stable plane in the gallium nitride wurtzite crystal structure, and the growth rate of this plane is lower than that of others. The {1$\bar{1}$01} planes of the <1$\bar{1}$00> oriented trenches and/or mask openings may be wavy, which implies the existence of more than one Miller index. It appears that competitive growth of selected {1$\bar{1}$01} planes occurs during the deposition which causes these planes to become unstable and which causes their growth rate to increase relative to that of the (1$\bar{1}$01) of trenches and/or mask openings oriented along <11$\bar{2}$0>.

The morphologies of the gallium nitride layers selectively grown from trenches and/or mask openings oriented along <1$\bar{1}$00> are also generally a strong function of the growth temperatures. Layers grown at 1000° C. may possess a truncated triangular shape. This morphology may gradually change to a rectangular cross-section as the growth temperature is increased. This shape change may occur as a result of the increase in the diffusion coefficient and therefore the flux of the gallium species along the (0001) top plane onto the {1$\bar{1}$01} planes with an increase in growth temperature. This may result in a decrease in the growth rate of the (0001) plane and an increase in that of the {1$\bar{1}$01}. This phenomenon has also been observed in the selective growth of gallium arsenide on silicon dioxide. Accordingly, temperatures of 1100° C. appear to be most preferred.

The morphological development of the gallium nitride regions also appears to depend on the flow rate of the TEG. An increase in the supply of TEG generally increases the growth rate in both the lateral and the vertical directions. However, the lateral/vertical growth rate ratio decrease from 1.7 at the TEG flow rate of 13 μmol/min to 0.86 at 39 μmol.min. This increased influence on growth rate along <0001> relative to that of <11$\bar{2}$0> with TEG flow rate may be related to the type of reactor employed, wherein the reactant gases flow vertically and perpendicular to the substrate. The considerable increase in the concentration of the gallium species on the surface may sufficiently impede their diffusion to the {1$\bar{1}$01} planes such that chemisorption and gallium nitride growth occur more readily on the (0001) plane.

Continuous 2 µm thick gallium nitride semiconductor layers may be obtained using 3 µm wide trenches and/or mask openings spaced 7 µm apart and oriented along <1$\bar{1}$00>, at 1100° C. and a TEG flow rate of 26 µmol/min. The continuous gallium nitride semiconductor layers may include subsurface voids that form when two growth fronts coalesce. These voids may occur most often using lateral growth conditions wherein rectangular trenches and/or mask openings having vertical {11$\bar{2}$0} side facets developed.

The continuous gallium nitride semiconductor layers may have a microscopically flat and pit-free surface. The surfaces of the laterally grown gallium nitride layers may include a terrace structure having an average step height of 0.32 nm. This terrace structure may be related to the laterally grown gallium nitride, because it is generally not included in much larger area films grown only on aluminum nitride buffer layers. The average RMS roughness values may be similar to the values obtained for the underlying gallium nitride layer 104.

Threading dislocations, originating from the interface between the underlying gallium nitride layer 104 and the buffer layer 102b, appear to propagate to the top surface of the underlying gallium nitride layer 104. The dislocation density within these regions is approximately $10^9$ cm$^{-2}$. By contrast, threading dislocations do not appear to readily propagate laterally. Rather, the lateral gallium nitride regions 108a and 308a contain only a few dislocations. These few dislocations may be formed parallel to the (0001) plane via the extension of the vertical threading dislocations after a 90° bend in the regrown region. These dislocations do not appear to propagate to the top surface of the overgrown gallium nitride layer.

As described, the formation mechanism of the selectively grown gallium nitride layers is lateral epitaxy. The two main stages of this mechanism are vertical growth and lateral growth. During vertical growth through a mask, the deposited gallium nitride grows selectively within the mask openings more rapidly than it grows on the mask, apparently due to the much higher sticking coefficient, s, of the gallium atoms on the gallium nitride surface (s=1) compared to on the mask (s<<1). Since the SiO$_2$ bond strength is 799.6 kJ/mole and much higher than that of Si—N (439 kJ/mole), Ga—N (103 kJ/mole), and Ga—O (353.6 kJ/mole), Ga or N atoms should not readily bond to the mask surface in numbers and for a time sufficient to cause gallium nitride nuclei to form. They would either evaporate or diffuse along the mask surface to the opening in the mask or to the vertical gallium nitride surfaces which have emerged. During lateral growth, the gallium nitride grows simultaneously both vertically and laterally.

Surface diffusion of gallium and nitrogen on the gallium nitride may play a role in gallium nitride selective growth. The major source of material appears to be derived from the gas phase. This may be demonstrated by the fact that an increase in the TEG flow rate causes the growth rate of the (0001) top facets to develop faster than the (1$\bar{1}$01) side facets and thus controls the lateral growth.

The laterally grown gallium nitride bonds to the underlying mask sufficiently strongly so that it generally does not break away on cooling. However, lateral cracking within the SiO$_2$ mask may take place due to thermal stresses generated on cooling. The viscosity (ρ) of the SiO$_2$ at 1050° C. is about $10^{15.5}$ poise which is one order of magnitude greater than the strain point (about $10^{14.5}$ poise) where stress relief in a bulk amorphous material occurs within approximately six hours. Thus, the SiO$_2$ mask may provide limited compliance on cooling. As the atomic arrangement on the amorphous SiO$_2$ surface is quite different from that on the GaN surface, chemical bonding may occur only when appropriate pairs of atoms are in close proximity. Extremely small relaxations of the silicon and oxygen and gallium and nitrogen atoms on the respective surfaces and/or within the bulk of the SiO$_2$ may accommodate the gallium nitride and cause it to bond to the oxide. Accordingly, the embodiments of FIGS. 1–5 and 11–15, which need not employ a mask, may be particularly advantageous.

In conclusion, lateral epitaxial overgrowth may be obtained from sidewalls of an underlying gallium nitride layer via MOVPE. The growth may depend strongly on the sidewall orientation, growth temperature and TEG flow rate. Coalescence of overgrown gallium nitride regions to form regions with both extremely low densities of dislocations and smooth and pit-free surfaces may be achieved through 3 µm wide trenches between 7 µm wide posts and extending along the <1$\bar{1}$00> direction, at 1100° C. and a TEG flow rate of 26 µmol/min. The lateral overgrowth of gallium nitride from sidewalls via MOVPE may be used to obtain low defect density regions for microelectronic devices, without the need to use masks.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of fabricating a gallium nitride semiconductor layer comprising the step of:

laterally growing a sidewall of an underlying gallium nitride layer into a trench in the underlying gallium nitride layer to thereby form a lateral gallium nitride semiconductor layer.

2. A method according to claim 1 wherein the laterally growing step is followed by the step of forming microelectronic devices in the lateral gallium nitride semiconductor layer.

3. A method according to claim 1 wherein the laterally growing step comprises the step of growing a pair of sidewalls of the underlying gallium nitride layer into a trench in the underlying gallium nitride layer between the pair of sidewalls until the grown pair of sidewalls coalesce in the trench.

4. A method according to claim 1 wherein the laterally growing step comprises the step of laterally growing the sidewall of the underlying gallium nitride layer using metalorganic vapor phase epitaxy.

5. A method according to claim 1 wherein the laterally growing step is preceded by the step of forming the underlying gallium nitride layer including the sidewall on a substrate.

6. A method according to claim 5 wherein the forming step comprises the steps of:

forming a buffer layer on a substrate; and forming the underlying gallium nitride layer on the buffer layer opposite the substrate.

7. A method according to claim 5 wherein the forming step comprises the step of forming the trench in the underlying gallium nitride layer, the trench including the sidewall.

8. A method according to claim 5 wherein the forming step comprises the step of forming a post on the underlying gallium nitride layer, the post including the sidewall and defining the trench.

9. A method according to claim 1 wherein the underlying gallium nitride layer includes a defect density, and wherein the step of laterally growing a sidewall of an underlying gallium nitride layer into a trench in the underlying gallium nitride layer to thereby form a lateral gallium nitride layer comprises the steps of:

laterally growing the sidewall of the underlying gallium nitride layer to thereby form the lateral gallium nitride layer of lower defect density than the defect density; and vertically growing the lateral gallium nitride layer while propagating the lower defect density.

10. A method according to claim 1 wherein the growing step comprises the step of growing the sidewall of the underlying gallium nitride layer using metalorganic vapor phase epitaxy of triethylgallium at 13–39 $\mu$mol/min and ammonia at 1500 sccm at a temperature of 1000° C.–1100° C.

11. A method according to claim 7 wherein the trench forming step comprises the step of selectively etching the underlying gallium nitride layer to form the trench that includes the sidewall.

12. A method according to claim 8 wherein the post forming step comprises the step of selectively growing the underlying gallium nitride layer to form the post including the sidewall.

13. A gallium nitride semiconductor structure comprising:
an underlying gallium nitride layer including a trench having a sidewall; and
a lateral gallium nitride layer that extends from the sidewall of the underlying gallium nitride layer into the trench.

14. A structure according to claim 13 further comprising:
a vertical gallium nitride layer that extends from the lateral gallium nitride layer.

15. A structure according to claim 13 further comprising:
a plurality of microelectronic devices in the lateral gallium nitride layer.

16. A structure according to claim 13 further comprising a substrate, and wherein the underlying gallium nitride layer is on the substrate.

17. A structure according to claim 16 further comprising a buffer layer between the substrate and the underlying gallium nitride layer.

18. A structure according to claim 13 wherein the trench includes a pair of the sidewalls, and wherein the lateral gallium nitride layer extends from the pair of sidewalls to define a continuous lateral gallium nitride.

19. A structure according to claim 13 wherein the underlying gallium nitride layer includes a post thereon, the post including the sidewall and defining the trench.

20. A structure according to claim 13 wherein the underlying gallium nitride layer includes a defect density, wherein the lateral gallium nitride layer is of lower defect density than the defect density.

21. A method of fabricating a gallium nitride semiconductor layer comprising the step of:
laterally growing a plurality of sidewalls of an underlying gallium nitride layer into a plurality of trenches in the underlying gallium nitride layer to thereby form a lateral gallium nitride layer.

22. A method according to claim 21 wherein the laterally growing step is followed by the steps of:
masking the lateral gallium nitride layer with a mask that includes an array of openings therein; and
growing the lateral gallium nitride layer through the array of openings and onto the mask, to thereby form an overgrown gallium nitride semiconductor layer.

23. A method according to claim 21 wherein the growing step is followed by the steps of:
vertically growing the lateral gallium nitride layer;
forming a plurality of second sidewalls in the vertically grown lateral gallium nitride layer to define a plurality of second trenches; and
laterally growing the plurality of second sidewalls of the vertically grown lateral gallium nitride layer into the plurality of second trenches, to thereby form a second lateral gallium nitride semiconductor layer.

24. A method according to claim 22 wherein the growing step is followed by the step of forming microelectronic devices in the overgrown gallium nitride semiconductor layer.

25. A method according to claim 23 wherein the step of laterally growing the plurality of second sidewalls is followed by the step of forming microelectronic devices in the second lateral gallium nitride semiconductor layer.

26. A method according to claim 21 wherein the laterally growing step comprises the step of growing the plurality of sidewalls of the underlying gallium nitride layer into the plurality of trenches in the underlying gallium nitride layer until the plurality of grown sidewalls coalesce in the trenches.

27. A method according to claim 22 wherein the growing step comprises the step of growing the lateral gallium nitride layer through the array of openings and onto the mask until the grown lateral gallium nitride layer coalesces on the mask to form a continuous overgrown gallium nitride semiconductor layer.

28. A method according to claim 23 wherein the step of laterally growing the plurality of second sidewalls comprises the step of laterally growing the plurality of second sidewalls of the vertically grown lateral gallium nitride layer into the plurality of second trenches until the plurality of laterally grown second sidewalls coalesce in the plurality of second trenches.

29. A method according to claim 21 wherein the laterally growing step comprises the step of laterally growing the plurality of sidewalls of the underlying gallium nitride layer using metalorganic vapor phase epitaxy.

30. A method according to claim 21 wherein the laterally growing step is preceded by the step of forming the underlying gallium nitride layer including the plurality of sidewalls on a substrate.

31. A method according to claim 30 wherein the forming step comprises the steps of:
forming a buffer layer on a substrate; and
forming the underlying gallium nitride layer on the buffer layer opposite the substrate.

32. A method according to claim 30 wherein the forming step comprises the step of forming the plurality of trenches in the underlying gallium nitride layer, the plurality of trenches including the plurality of sidewalls.

33. A method according to claim 30 wherein the forming step comprises the step of forming a plurality of posts in the underlying gallium nitride layer, the plurality of posts including the plurality of sidewalls and defining the plurality of trenches.

34. A method according to claim 24 wherein the underlying gallium nitride layer includes a defect density, and wherein the step of laterally growing a plurality of sidewalls of the underlying gallium nitride layer into the plurality of trenches in the underlying gallium nitride layer to thereby form a lateral gallium nitride layer comprises the steps of:
laterally growing the plurality of sidewalls of the underlying gallium nitride layer into the plurality of trenches to thereby form a lateral gallium nitride semiconductor layer of lower defect density than the defect density; and vertically growing the laterally gallium nitride layer while propagating the lower defect density.

35. A method according to claim 21 wherein the laterally growing step comprises the step of laterally growing the plurality of sidewalls of the underlying gallium nitride layer using metalorganic vapor phase epitaxy of triethylgallium at 13—39 μmol/min and ammonia at 1500 sccm at a temperature of 1000° C.–1100° C.

36. A gallium nitride semiconductor structure comprising:
an underlying gallium nitride layer including a plurality of trenches having a plurality of sidewalls; and
a lateral gallium nitride layer that extends from the plurality of sidewalls of the underlying gallium nitride layer into the plurality of trenches.

37. A structure according to claim 36 further comprising:
a mask including an array of openings therein on the lateral gallium nitride layer; and
a vertical gallium nitride layer that extends from the lateral gallium nitride layer, through the openings and onto the mask.

38. A structure according to claim 36 further comprising:
a vertical gallium nitride layer that extends from the lateral gallium nitride layer, wherein the vertical gallium nitride layer includes a plurality of second sidewalls therein; and
a second lateral gallium nitride layer that extends from the plurality of second sidewalls.

39. A structure according to claim 37 further comprising:
a plurality of microelectronic devices in the lateral gallium nitride layer.

40. A structure according to claim 38 further comprising:
a plurality of microelectronic devices in the second lateral gallium nitride layer.

41. A structure according to claim 36 further comprising a substrate, and wherein the underlying gallium nitride layer is on the substrate.

42. A structure according to claim 41 further comprising a buffer layer between the substrate and the underlying gallium nitride layer.

43. A structure according to claim 36 wherein the lateral gallium nitride layer extends from the plurality of sidewalls into the plurality of trenches to define a continuous lateral gallium nitride layer in the trenches.

44. A structure according to claim 36 wherein the underlying gallium nitride layer includes a plurality of posts thereon, the plurality of posts including the plurality of sidewalls and defining the plurality of trenches.

45. A structure according to claim 36 wherein the underlying gallium nitride layer includes a defect density and wherein the lateral gallium nitride layer is of lower defect density than the defect density.

46. A method according to claim 1 wherein the laterally growing step is followed by the step of forming a microelectronic device in the lateral gallium nitride semiconductor layer.

47. A method according to claim 5 wherein the sidewall is orthogonal to the substrate.

48. A method according to claim 5 wherein the sidewall is oblique to the substrate.

49. A method according to claim 5 wherein the step of forming the underlying gallium nitride layer comprises the step of forming the trench in the underlying gallium nitride layer, extending into the underlying gallium nitride layer but not into the substrate.

50. A method according to claim 6 wherein the step of forming the underlying gallium nitride layer comprises the step of forming the trench in the underlying gallium nitride layer, extending into the underlying gallium nitride layer but not into the buffer layer.

51. A method according to claim 6 wherein the step of forming the underlying gallium nitride layer comprises the step of forming the trench in the underlying gallium nitride layer, extending into the underlying gallium nitride layer and into the buffer layer but not into the substrate.

52. A method according to claim 6 wherein the step of forming the underlying gallium nitride layer comprises the step of forming the trench in the underlying gallium nitride layer, extending into the underlying gallium nitride layer, into the buffer layer and into the substrate.

53. A structure according to claim 13 further comprising:
a microelectronic device in the lateral gallium nitride semiconductor layer.

54. A structure according to claim 13 wherein the sidewall is orthogonal to the substrate.

55. A structure according to claim 13 wherein the sidewall is oblique to the substrate.

56. A structure according to claim 16 wherein the trench extends into the underlying gallium nitride layer but not into the substrate.

57. A structure according to claim 16 wherein the trench extends into the underlying gallium nitride layer and into the substrate.

58. A structure according to claim 17 wherein the trench extends into the underlying gallium nitride layer but not into the buffer layer.

59. A structure according to claim 17 wherein the trench extends into the underlying gallium nitride layer and into the buffer layer.

60. A method according to claim 22 wherein the growing step is followed by the step of forming a microelectronic device in the overgrown gallium nitride semiconductor layer.

61. A method according to claim 30 wherein the sidewalls are orthogonal to the substrate.

62. A method according to claim 30 wherein the sidewalls are oblique to the substrate.

63. A method according to claim 30 wherein the step of forming the underlying gallium nitride layer comprises the step of forming the trenches in the underlying gallium nitride layer, extending into the underlying gallium nitride layer but not into the substrate.

64. A method according to claim 31 wherein the step of forming the underlying gallium nitride layer comprises the step of forming the trenches in the underlying gallium nitride layer, extending into the underlying gallium nitride layer but not into the buffer layer.

65. A method according to claim 31 wherein the step of forming the underlying gallium nitride layer comprises the step of forming the trench in the underlying gallium nitride layer, extending into the underlying gallium nitride layer and into the buffer layer but not into the substrate.

66. A method according to claim 31 wherein the step of forming the underlying gallium nitride layer comprises the step of forming the trench in the underlying gallium nitride layer, extending into the underlying gallium nitride layer, into the buffer layer and into the substrate.

67. A structure according to claim 38 further comprising:
a microelectronic device in the second lateral gallium nitride semiconductor layer.

68. A structure according to claim 36 wherein the sidewalls are orthogonal to the substrate.

69. A structure according to claim 36 wherein the sidewalls are oblique to the substrate.

70. A structure according to claim 41 wherein the trenches extend into the underlying gallium nitride layer but not into the substrate.

71. A structure according to claim 41 wherein the trenches extend into the underlying gallium nitride layer and into the substrate.

72. A structure according to claim 42 wherein the trenches extend into the underlying gallium nitride layer but not into the buffer layer.

73. A structure according to claim 17 wherein the trenches extend into the underlying gallium nitride layer and into the buffer layer.

74. A method according to claim 1 wherein the trench includes a trench floor and wherein the step of laterally growing comprises the step of laterally growing the sidewall of the underlying gallium nitride layer into the trench, spaced apart from the trench floor, to thereby form a cantilevered lateral gallium nitride semiconductor layer.

75. A method according to claim 3 wherein the trench includes a trench floor and wherein the step of laterally growing comprises the step of laterally growing the pair of sidewalls of the underlying gallium nitride layer into the trench, spaced apart from the trench floor.

76. A structure according to claim 13 wherein the trench includes a trench floor and wherein the lateral gallium nitride layer is a cantilevered lateral gallium nitride layer that extends from the sidewall of the underlying gallium nitride layer into the trench and is spaced apart from the trench floor.

77. A structure according to claim 18 wherein the trench includes a trench floor and wherein the lateral gallium nitride layer extends from the pair of sidewalls of the underlying gallium nitride layer into the trench and is spaced apart from the trench floor.

78. A method according to claim 21 wherein the trenches include trench floors and wherein the step of laterally growing comprises the step of laterally growing the plurality of sidewalls of the underlying gallium nitride layer into the plurality of trenches, spaced apart from the trench floors, to thereby form cantilevered lateral gallium nitride semiconductor layers.

79. A method according to claim 23 wherein the second trenches include second trench floors and wherein the step of laterally growing comprises the step of laterally growing the plurality of second sidewalls of the vertically grown lateral gallium nitride layer into the plurality of second trenches, spaced apart from the second trench floors, to thereby form a cantilevered second lateral gallium nitride semiconductor layer.

80. A structure according to claim 36 wherein the trenches include trench floors and wherein the lateral gallium nitride layer is a cantilevered lateral gallium nitride layer that extends from the plurality of sidewalls of the underlying gallium nitride layer into the trenches and is spaced apart from the trench floors.

* * * * *

UNITED STATES PATENT AND TRADEMARK OFFICE
CERTIFICATE OF CORRECTION

PATENT NO. : 6,265,289 B1
DATED : July 24, 2001
INVENTOR(S) : Zheleva et al.

It is certified that error appears in the above-identified patent and that said Letters Patent is hereby corrected as shown below:

Title page,
Item [56], References Cited, U.S.PATENT DOCUMENTS, insert the following:
-- 6,153,010        11/2000        Kiyoku et al.   117/95
   6,121,121        09/2000        Koide           438/481
   5,915,194        06/1999        Powell et al.   438/478 --
FOREIGN PATENT DOCUMENTS, insert the following:
-- 11-145516       05/1999        (JP)
   8-153931         06/1996        (JP)
   8-125251         05/1996        (JP)
   8-116093         05/1996        (JP)
   8-18159           01/1996        (JP)
   5-41536           02/1993        (JP)
   5-7016            01/1993        (JP)
   4-188678         07/1992        (JP)
   3-132016         06/1991        (JP)
OTHER PUBLICATIONS, insert the following:
-- Akasaki et al., *Effects of AlN Buffer Layer on Crystallographic Structure and on Electrical and Optical Properties of GaN and $Ga_{1-x}Al_xN$ ($0<x\leq0.4$) Films Grown on Sapphire Substrate by MOVPE*, Journal of Crystal Growth, Vol. 98, 1989, pp. 209-219

*Gallium Nitride-20000-Technology, Status, Applications, and Market Forecasts,* Strategies Unlimited, Report SC-23, May 2000

Chen et al., *Dislocation Reducing in GaN Thin Films Via Lateral Overgrowth From Trenches,* Applied Physics Letters, Vol. 75, No. 14, October 4, 1999, pp. 2062-2063

*Leo Unmasked by Pendeo-Epitaxy,* Nitride News, Compound Semiconductor, March 1999, p. 16

Nakamura, *InGaN/GaN/AlGaN-Based Laser Diodes,* Properties, Processing and Applications of Gallium Nitride and Related Semiconductors, EMIS Datareviews Series No. 23, 1998, pp. 587-595

Hiramatsu et al., *Selective Area Growth and Epitaxial Lateral Overgrowth of GaN,* Properties, Processing and Applications of Gallium Nitride and Related Semiconductors, EMIS Datareviews Series No. 23, 1998, pp. 440-446

UNITED STATES PATENT AND TRADEMARK OFFICE
CERTIFICATE OF CORRECTION

PATENT NO. : 6,265,289 B1
DATED : July 24, 2001
INVENTOR(S) : Zheleva et al.

It is certified that error appears in the above-identified patent and that said Letters Patent is hereby corrected as shown below:

OTHER PUBLICATIONS, (cont'd), insert the following:
Sakai, *Defect Structure in Selectively Grown GaN Films With Low Threading Dislocation Density,* Appl. Phys. Lett., Vol. 71, No. 16, October 20, 1997, pp. 2259-2261

Gustafsson et al., *Investigations of High Quality $Ge_xSi_{1-x}$ Grown by Heteroepitaxial Lateral Overgrowth Using Cathoduluminescence,* Inst. Phys. Conf. Ser. No. 134: Section 11, Micros. Semicond. Mater. Conf., Oxford, April 5-8, 1993, pp. 675-678

Givargizov, *Other Approaches to Oriented Crystallization on Amorphous Substrates,* Chapter 4, Oriented Crystallization on Amorphous Substrates, Plenum Press, 1991, pp. 221-264

Ujiie et al., *Epitaxial Lateral Overgrowth of GaAs on a Si Substrate,* Jpn. J. Appl. Phys., Vol. 28, 1989, p. L337-L339

Ishiwara et al., *Lateral Solid Phase Epitaxy of Amorphous Si Films on Si Substrates With $SiO_2$ Patterns,* Applied Physics Letters, Vol. 43, No. 11, December 1, 1983, pp. 1028-1030

Jastrzebski, *SOI by CVD: Epitaxial Lateral Overgrowth (ELO) Process-Review,* Journal of Crystal Growth, Vol. 63, 1983, pp. 493-526

Rathman et al., *Lateral Epitaxial Overgrowth of Silicon on $SiO_2$,* Journal of the Electrochemical Society, October 1982, pp. 2303-2306

Shaw, *Selective Epitaxial Deposition of Gallium Arsenide in Holes,* Journal of the Electrochemical Society, September 1966, pp. 904-908

Tausch, Jr. et al., *A Novel Crystal Growth Phenomenon: Single Crystal GaAs Overgrowth Onto Silicon Dioxide,* Journal of the Electrochemical Society, July 1965, pp. 706-709

Joyce et al., *Selective Epitaxial Deposition of Silicon,* Nature, Vol. 4840, August 4, 1962, pp. 485-486 --

UNITED STATES PATENT AND TRADEMARK OFFICE
CERTIFICATE OF CORRECTION

PATENT NO.    : 6,265,289 B1
DATED         : July 24, 2001
INVENTOR(S)   : Zheleva et al.

It is certified that error appears in the above-identified patent and that said Letters Patent is hereby corrected as shown below:

Column 12,
Line 60, please change "claim 24" to -- claim 21 --.

Signed and Sealed this

Twenty-fifth Day of February, 2003

JAMES E. ROGAN
*Director of the United States Patent and Trademark Office*